United States Patent [19]

Neppl et al.

[11] Patent Number: 4,855,245

[45] Date of Patent: Aug. 8, 1989

[54] METHOD OF MANUFACTURING INTEGRATED CIRCUIT CONTAINING BIPOLAR AND COMPLEMENTARY MOS TRANSISTORS ON A COMMON SUBSTRATE

[75] Inventors: Franz Neppl, Munich; Josef Winnerl, Landshut, all of Fed. Rep. of Germany

[73] Assignee: Siemens Aktiengesellschaft, Berlin and Munich, Fed. Rep. of Germany

[21] Appl. No.: 253,418

[22] Filed: Oct. 4, 1988

Related U.S. Application Data

[63] Continuation of Ser. No. 897,299, Aug. 18, 1986, abandoned.

[30] Foreign Application Priority Data

Sep. 13, 1985 [DE] Fed. Rep. of Germany ....... 3532817

[51] Int. Cl.$^4$ .............................................. H01L 21/72
[52] U.S. Cl. .................................. 437/31; 437/57; 437/34; 148/DIG. 9; 357/43; 357/59
[58] Field of Search ............... 437/31, 32, 33, 34, 437/51, 56, 57, 192, 188; 148/DIG. 9, DIG. 10; 357/59 H, 43

[56] References Cited

U.S. PATENT DOCUMENTS

| | | |
|---|---|---|
| 3,913,124 | 10/1975 | Roberson . |
| 4,016,596 | 4/1977 | Magdo et al. .................. 437/54 |
| 4,180,596 | 12/1979 | Crowder et al. . |
| 4,256,515 | 3/1981 | Miles et al. ..................... 437/46 |
| 4,283,439 | 8/1981 | Higashinakagawa et al. . |
| 4,299,024 | 11/1981 | Piotrowski . |
| 4,424,578 | 1/1984 | Miyamoto . |
| 4,436,582 | 3/1984 | Saxena . |
| 4,454,647 | 6/1984 | Joy et al. . |
| 4,459,741 | 7/1984 | Schwabe et al. . |
| 4,471,376 | 9/1984 | Morcom et al. . |
| 4,475,279 | 10/1984 | Gahle ............................. 437/31 |
| 4,484,388 | 11/1984 | Iwasaki . |
| 4,505,766 | 3/1985 | Nagumo et al. . |
| 4,510,670 | 4/1985 | Schwabe et al. ............... 357/71 |
| 4,525,920 | 7/1985 | Jacobs et al. .................. 437/57 |
| 4,529,456 | 7/1985 | Anzai et al. ................... 357/34 |
| 4,536,945 | 8/1985 | Gray et al. .................... 437/57 |
| 4,571,817 | 2/1986 | Birritella et al. . |
| 4,604,790 | 8/1986 | Bonn ............................. 437/57 |
| 4,637,125 | 1/1987 | Iwasaki et al. . |
| 4,686,557 | 8/1987 | Mahrla .......................... 357/34 |
| 4,714,951 | 12/1987 | Baudrant et al. ............... 357/23.9 |

FOREIGN PATENT DOCUMENTS

| | | |
|---|---|---|
| 0057126 | 8/1982 | European Pat. Off. . |
| 0139266 | 5/1985 | European Pat. Off. . |
| 55-46535 | 4/1980 | Japan . |
| 0017943 | 1/1985 | Japan ............................. 437/56 |
| 2077993 A | 12/1981 | United Kingdom . |
| 2128024 | 4/1984 | United Kingdom ............. 437/56 |

OTHER PUBLICATIONS

"Method to Reduce Mechanical Stress within the Emitter of Bipolar Transistors", IBM Tech Disclosure Bulletin, vol. 28, No. 4, Sep. 1985.

(List continued on next page.)

Primary Examiner—Brian E. Hearn
Assistant Examiner—Tuan Nguyen
Attorney, Agent, or Firm—Hill, Van Santen, Steadman & Simpson

[57] ABSTRACT

An integrated circuit containing bipolar and complementary MOS transistors wherein the emitter terminals of the bipolar transistors as well as the gate electrodes of the MOS transistors are composed of the same material, consisting of a metal silicide or of a double layer containing a metal silicide and a polysilicon layer. The emitter base terminals are arranged in self-adjusting fashion relative to one another and the collector is formed as a buried zone. The collector terminal is annularly disposed about the transistor. As a result of the alignment in dependent spacing between the emitter and the base contact, the base series resistance is kept low and a reduction of the space requirement is achieved. The doping of the bipolar emitter and of the n-channel source/drain occurs independently. The method for the manufacture of the integrated circuit employs an n-doped gate material of the MOS transistors as a diffusion source and as a terminal for the emitters of the bipolar transistors and does not require an additional photolithography step. Because of the annular, deep collector region, a reduction of the collector series resistance and an increased latch-up hardness are achieved. The integrated semiconductor circuit is employed in VLSI circuits having high switching speeds.

10 Claims, 5 Drawing Sheets

OTHER PUBLICATIONS

"A 1.0 um N-Well CMOS/Bipolar Technology for VLSI Circuits" by Miyamoto et al., IEDM Technology Digest (Dec. 1983) pp. 63-66.

"1.0-um n-Well CMOS/Bipolar Technology", Momose et al., IEEE Transactions on Electron Devices, vol. ED-32, No. 2, Feb. 1985, pp. 217-223.

"Refractory Silicides of Titanium and Tantalum for Low-Resistivity Gates and Interconnects", Murarka et al., IEEE Journal of Solid-State Circuits, vol. SC-15, No. 4, Aug. 1980, pp. 474-482.

"How the Bi-FET Process Benefits Linear Circuits", Russell et al., Electronics, Jun. 8, 1978, pp. 113-117.

"Application of $MoSi_2$ to the Double-Level Interconnections of $I^2L$ Circuits", Sasaki et al., IEEE Transactions on Electron Devices, vol. ED-27, No. 8, Aug. 1980, pp. 1385-1389.

"Subnanosecond Self-Aligned $I^2L$/MTL Circuits":, D. D. Tang et al., IEEE Transactions on Electron Devices, vol. ED-27, No. 8, Aug. 1980, pp. 1379-1384.

Physics of Semiconductor Devices, Second Edition, by S. M. Sze, (1981) p. 32.

"Monolithic IC Puts Out 18 Watts", Electronics, vol. 42, Mar. 17, 1969, pp. 185-186.

IBM Technical Disclosure Bulletin, vol. 25, No. 3B, Aug. 1982, Title: "Poly Filled Trench Isolation", pp. 1482-1484.

METHOD OF MANUFACTURING INTEGRATED CIRCUIT CONTAINING BIPOLAR AND COMPLEMENTARY MOS TRANSISTORS ON A COMMON SUBSTRATE

This is a continuation of application Ser. No. 897,299, filed Aug. 18, 1986 abandoned.

BACKGROUND OF THE INVENTION

1. Field of the Invention

The present invention relates to an integrated circuit containing bipolar and complementary MOS transistors on a common substrate wherein the emitter terminals of the bipolar transistors as well as the gate electrodes of the MOS transistors are composed of the same material including at least one layer of a refractory metal silicide of a metal such as tantalum, tungsten, molybdenum, titanium or platinum.

2. Description of the Prior Art

An integrated circuit containing a bipolar transistor and an MOS transistor which are generated on a chip and wherein the contacts from the metal interconnect level to the diffused regions of the bipolar transistor and the gate electrode are composed of the same material consisting of a silicide of a refractory metal is known from European Patent Application No. 0 10 1 000. By employing such a silicide, the implantation mask used in traditional methods is eliminated, and the contacting of base, emitter and collector regions becomes independent of the metallization grid.

When bipolar transistors and complementary MOS transistors are to be produced simultaneously on a chip, an n-well CMOS process is used to form the base and the emitter regions and the base terminals of the bipolar transistors are simultaneously implanted with the source and drain regions of the MOS transistors and are contacted with metal. Such a process has been described, for example, in German Patent Application No. P 35 19 790.0 (corresponding to Jacobs et al U.S. Ser. No. 869,306, filed June 2, 1986, and assigned to the assignee of the present application). In this process, npn bipolar transistors are located in n-doped wells, an n-well forming the collector of the transistor an covering buried n+-doped regions which are connected in the bipolar transistor region by deeply extending collector terminals. The buried part and the collector terminal are generated before the well in this process. The well implantation is self-adjusting to the implantation of the deep collector terminal annularly placed into the well. A reduction of collector series resistance as well as an increased latch-up stability are achieved.

The following disadvantages, however, occur due to the process limitations, and due to the metal contacting.

(1) The transistor size is limited by the metallization grid.

(2) The distance from emitter to base contact is dependent on adjustment.

(3) Employing different dopants for generating the emitter zones of the bipolar transistor and the source/-drain zones of the n-channel MOS transistors in the substrate is only possible with the use of an additional photolithography step.

SUMMARY OF THE INVENTION

The present invention provides an integrated circuit containing CMOS transistors and bipolar transistors on a single chip wherein, in addition to an increase in the packing density, the advantages of the silicide layer or dual layer of polysilicide and metallic silicide wiring are combined with the advantages of a deeply extending collector terminal in the bipolar transistors.

The present invention also provides a method to permit the manufacture of this integrated semiconductor circuit in more simple, mask-saving process steps, making it possible to dope the emitters of the bipolar transistors independently of the generation of the source/drain zones of the n-channel MOS transistors.

The invention relates to an integrated circuit of the type described which is characterized by the following features:

(a) The emitter-base terminals are arranged in self-adjusting fashion relative to one another;

(b) At least the emitter terminal is composed of a doped silicide or of a doped double layer of polysilicon and silicide;

(c) The collector is contained in the substrate as a buried zone; and (d) The collector terminal is annularly arranged around the bipolar transistor.

The present invention also relates to a method for the manufacture of an integrated semiconductor circuit containing a bipolar transistor and complementary n-channel and p-channel MOS transistors which includes:

(a) providing a p-doped semiconductor substrate, (b) providing a double insulating layer of silicon oxide and silicon nitride over the substrate, (c) structuring the silicon nitride layer to define areas in which collector terminals are to be formed, (d) implanting n-doping ions into said areas, (e) removing the silicon nitride in those areas of said substrate in which n-wells are to be formed, (f) implanting n-doping ions into the areas in which n-wells are to be formed, (g) diffusing said n-doping ions to form said n-wells while simultaneously oxidizing the surface of the n-well areas, (h) implanting boron ions to form a surface distal region of a channel zone of said n-channel transistor, using the oxide surfaces produced in step (g) as a mask, (i) applying a double layer of silicon oxide and silicon nitride, (j) implanting boron ions into the desired field oxide regions of said n-channel transistors, (k) locally oxidizing the field oxide regions utilizing the previously deposited silicon nitride as an oxidation mask, (l) oxidizing the surface to generate gate oxides, (m) boron-doping the channel regions of the n-channel and p-channel transistors, (n) boron-doping the base zone of the bipolar transistor, (o) removing the gate oxide in the region of said base zone, (p) depositing at least a single layer of a metal silicide over the surface, (q) depositing a surface-wide oxide layer over the surface, (r) implanting arsenic ions through said surface, (s) structuring the metal silicide layer of step (p) for the manufacture of the gate electrodes of the n-channel and p-channel transistors and the emitter terminal of the bipolar transistors, (t) generating the emitter zone of said bipolar transistor by high temperature treatment, (u) depositing a surface-wide silicon oxide layer by vapor phase deposition on the surface, (v) simultaneously forming the source/drain regions of the n-channel transistor and the n+ collector contact of the bipolar transistor by phosphorus ion implantation, (w) simultaneously forming the source/drain regions of the p-channel transistor and the p+ base contact of the bipolar transistor by boron ion implantation, and (x) applying terminal electrodes to the resulting transistor structures.

In a preferred form of the invention, step (b) recited above is preceded by the steps of n-doping the substrate to provide n+-doped zones in the p-doped substrate and providing a surface-wide p-doped epitaxial layer over the substrate.

The substrate may be a p-doped (100) oriented silicon substrate having a specific electrical resistance of about 20 ohm cm.

Alternatively, the method outlined above can be practiced with a p-doped (100) oriented silicon substrate having a specific electrical resistance of about 0.02 ohm cm.

In a modified form of the invention, the implanting of arsenic ions according to step (r) occurs before the surface-wide oxide deposition of step (q). In another feature of the invention, step (p) involves depositing a double layer of polysilicon and tantalum silicide, and the arsenic occurs during polysilicon deposition before the tantalum silicide is deposited, followed y the surface-wide oxide deposition of step (q).

In comparison with the method proposed in German Patent Application No. P 35 19 790.0, the method of the present invention has the following advantages:

1. The doped gate electrode material of the MOS transistors simultaneously serves as a diffusion source and as a terminal for the emitter of the bipolar transistors. Moreover, this emitter terminal serves as a mask for the base terminal implantation. As a result, the spacing of emitter to base contacts becomes independent of adjustment and is defined only by the spacer. The base series resistance is kept low.

2. The emitter is not implanted but diffused, i.e., the doping of the bipolar emitter and n-channel source/-drain occur independently of one another. Thus, the emitter can be doped with arsenic for achieving a flat pn-junction and the source/drain zones can be doped with phosphorus for improving the voltage strength without an additional photolithography step being required.

3. Due to the employment of a metal silicide or polycide as the emitter material, it eliminates the restriction by the metallization grid, thus providing an increase of the packing density of the circuit. Further, the emitter efficiency is increased when using the polycide.

4. The emitter width is not limited by the size of the contact hole.

In comparison to the method described in European Patent Application No. 0 101 000, the method of the present invention has the advantage of simultaneous manufacture of complementary MOS (CMOS) transistors with bipolar transistors being generated in the n-wells and having buried n+-doped zones and deep collector terminals annularly placed into the wells, thus resulting in a reduction of the collector series resistance as well as an increased latch-up hardness of the circuit. The distance between the emitter and the base terminal is independent of adjustment.

BRIEF DESCRIPTION OF THE DRAWINGS

A process for the simultaneous manufacture of bipolar and complementary MOS transistors on a common substrate (chip) will be set forth in greater detail with reference to FIGS. 1–14 as an exemplary embodiment.

DESCRIPTION OF THE PREFERRED EMBODIMENTS

Figure 1:
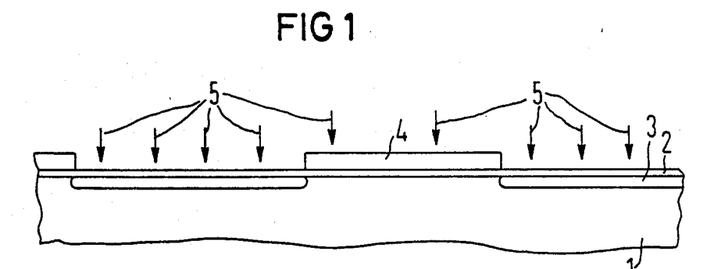
In FIGS. 1–12, the method steps are shown in sequence, with identical reference characters being provided for identical parts.

In FIG. 1, there is illustrated a monocrystalline p-doped (100) oriented silicon substrate wafer 1 having a specific electrical resistance of about 20 ohm cm and an $SiO_2$ layer 2. The buried collector region 3 is produced with the aid of a photoresist mask 4 in the usual manner, using an antimony or arsenic ion implantation with a dosage level of $3 \times 10^{15}$ cm$^{-2}$ and an energy level of 80 keV as illustrated by the arrows labeled 5.

Figure 2:
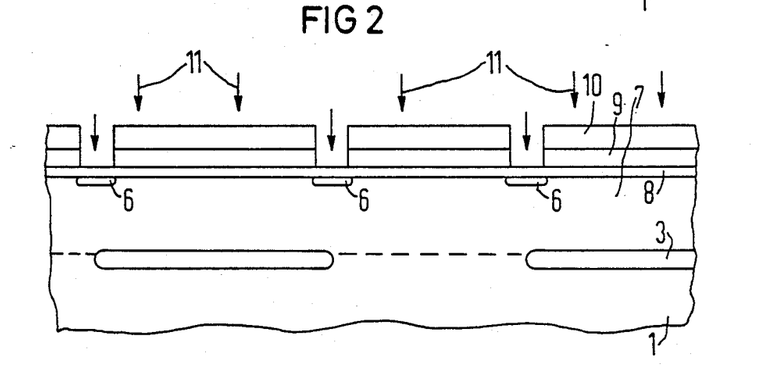

In FIG. 2, reference numeral 6 indicates a deep collector terminal which is produced after the removal of the $SiO_2$ layer 2. A 3 micron-thick p-doped epitaxial layer 7 having a specific electrical resistance of about 20 ohm cm is deposited on the structure shown in FIG. 1. After removal of the $SiO_2$ layer 2, the epitaxial layer 7 is covered with an insulating double layer composed of an $SiO_2$ layer 8 having a thickness of about 50 nm and a 140 nm thick chemically vapor deposited silicon nitride layer 9. By means of a photoresist technique utilizing a mask 10, the nitride layer 9 is structured and the deep collector implantation takes place as indicated by the arrows 11 using phosphorus ions with a dosage of about $3 \times 10^{15}$ cm$^{-2}$ and at an energy level of about 80 keV.

Figure 3:
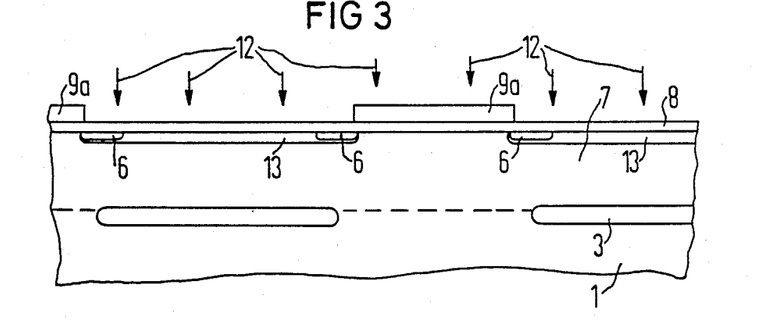
Figure 4:
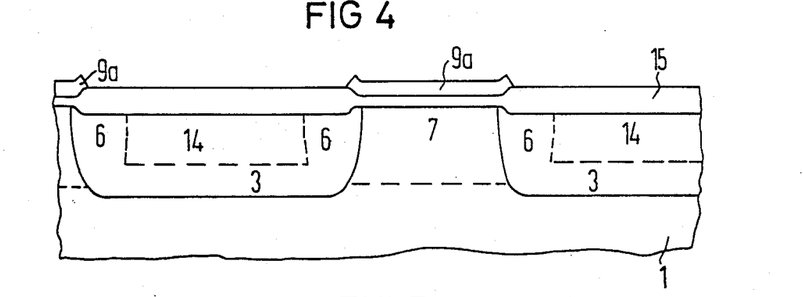

In FIG. 3, there are shown the steps involved in producing an n-well region identified at reference numeral 14 in FIG. 4. First, there is a phosphorus ion implantation as indicated by the arrows 12 with a dosage of about $2 \times 10^{12}$ cm$^{-2}$ and at an energy level of about 80 keV after the photoresist process (not shown) has taken place, with removal of the nitride structures over the n-well regions 14. The nitride structure 9a remains and the implanted regions 13 are formed.

In the following stages, FIG. 4, there are the steps of oxidation for masking the well regions 13, the inner diffusion of the antimony and phosphorus ions, i.e., the generation of the n-well 14 and the collector contact 6. There is produced an $SiO_2$ layer 15 on the surface, with the nitride structure 9a serving as a mask. At a high temperature of about 1150° C., the collector region is driven at least 2.5 microns and preferably about 3 microns into the substrate 1 so that the buried collector region 3 can be reached reliably.

Figure 5:
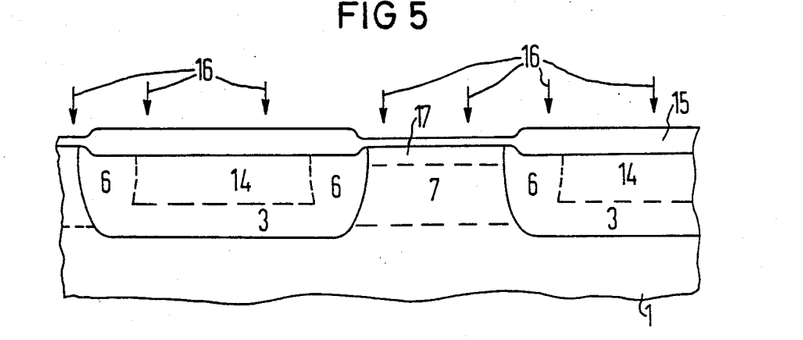

In FIG. 5, there is shown a sequence which occurs after removal of the silicon nitride structure 9a. The first deep implantation of the double channel implantation of the n-channel transistors is produced by means of a surface-wide deep implantation as indicated by the arrows 16 with boron ions using a dosage of $8 \times 10^{11}$ cm$^{-2}$ and an energy level of 60 keV. The $SiO_2$ layer 15 acts as a mask. There is thus produced a p-doped region 17 under the channel.

Figure 6:
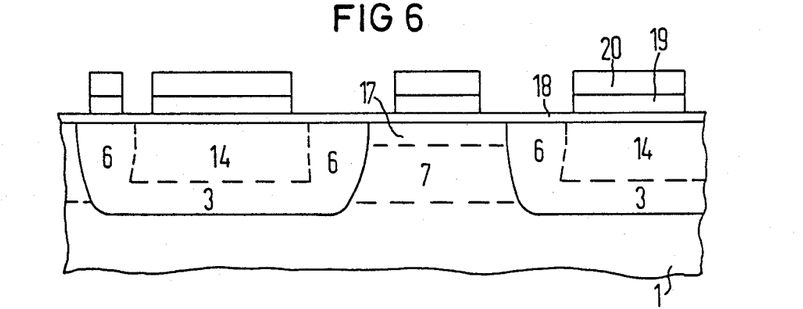

As indicated in FIG. 6, this procedure is followed by the production of a double layer 18, 19 composed of thermally grown SiO$_2$ to a thickness of about 50 nm over which there is a layer of silicon nitride measuring about 140 nm. The structuring of the silicon nitride layer 19 occurs through the use of a photoresist mask 20 of the subsequently occurring local oxidation (LOCOS).

Figure 7:
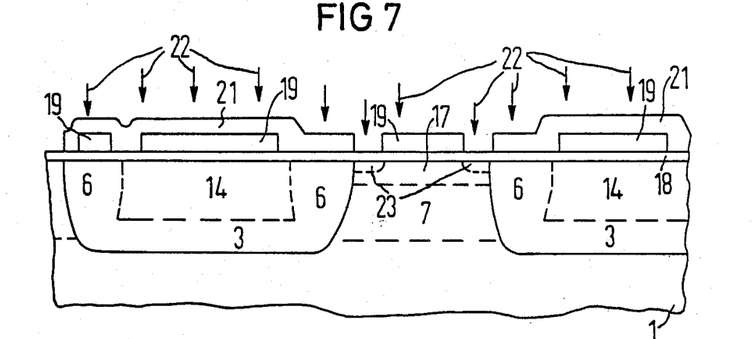

FIG. 7 represents the field doping in the n-channel region, produced by a boron ion implantation as indicated by the arrows 22 at a dosage level of $1.2 \times 10^{13}$ cm$^{-2}$, and an energy level of 25 keV, using a photoresist process which utilizes a mask 21. The p-doped regions 23 are thereby produced.

Figure 8:
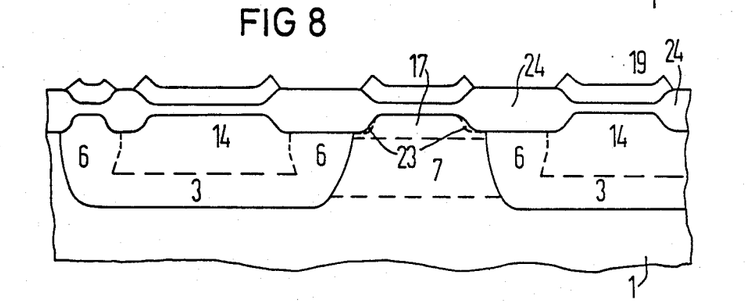

After removal of the photoresist mask 21, the field oxide required for separating the active transistor regions in the substrate 1 is generated on the SiO$_2$ layer 18 by local oxidation using the silicon nitride structure 19 as a mask. The oxide layer has a thickness of about 850 nm. The oxide layers have been identified with reference numeral 24 in FIG. 8.

The process described thus far employs steps which are substantially identical to the process steps of the aforementioned German Patent Application No. P 35 19 790.0 described in FIGS. 1–8 thereof.

Figure 9:
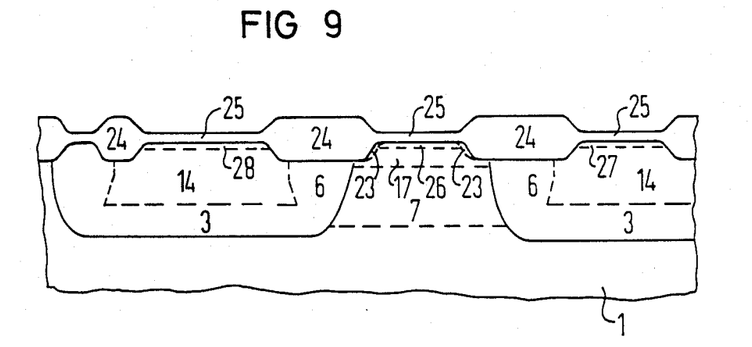

After removal of the silicon nitride structure 19, the gate oxidation to produce a layer thickness of gate oxide 25 of about 25 nm occurs. When polycide is to be employed as an emitter terminal and gate material, it is advisable to execute a deep and a flat channel implantation with boron ions (not shown) at this location to increase channel doping. The flat implantation is carried out surface-wide with a dosage and energy level of $2 \times 10^{11}$ cm$^{-2}$ and 25 keV, respectively, and the deep implantation is carried out with a phototechnique only in with a dosage and energy of $8 \times 10^{11}$ cm$^{-2}$ and 60 keV. The channel regions 26 and 27 and the p-region 28 in the base of the bipolar transistor are thereby formed.

Figure 10:
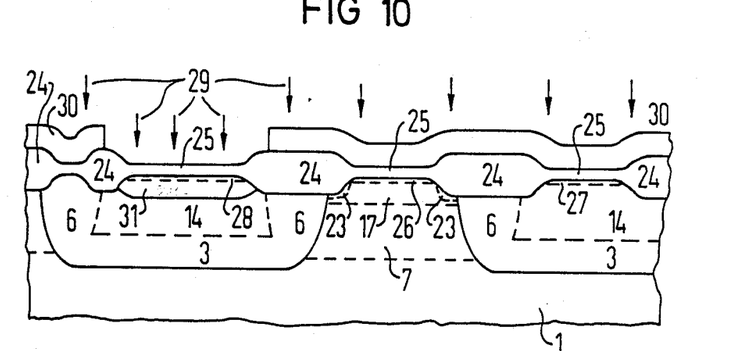

As seen in FIG. 10, the base implantation 29 of the bipolar transistor is now formed after application of a photoresist mask 30, using boron ions having a dosage and an energy of $9 \times 10^{13}$ cm$^{-2}$ and 80 keV. The p-doped base zone 31 is thus produced. The gate oxide layer 25 is removed in the region of the base zone 28, 31.

Figure 11:
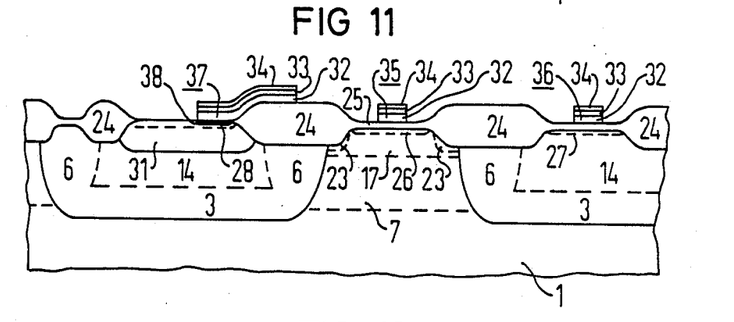

As seen in FIG. 11, the gate electrodes of the MOS transistors (35, 36) and the emitter terminal (37) of the bipolar transistor are generated after removal of the photoresist structure 30 with a surface-wide deposition of a double layer composed of a polysilicon layer 32 and a tantalum silicide layer 33. Subsequently, the electrodes and the emitter terminal are structured by means of a photoresist technique not specifically shown in this Figure by means of an oxide layer 34 deposited thereon. Instead of the double layer 32, 33, a single tantalum silicide layer 33 can also be employed. After a temperature treatment at 900° C., the emitter zone 38 is produced under the emitter terminal In FIG. 12 there is shown an intermediate oxide 39 in the form of a TEOS spacer layer, the oxide being generated by surface-wide deposition of a SiO$_2$ from the vapor phase. This preferably occurs by the thermal decomposition of tetraethylorthosilicate, to a thickness of about 100 nm. Following this, there is the simultaneous manufacture of the source/drain regions 40 (FIG. 12) of the n-channel transistors B and of the n+ collector contact region 41 of the bipolar transistor A by phosphorus ion implantation at a dose and energy of $8 \times 10^{15}$ cm$^{-2}$ and a 80 keV using a photoresist masking of the remaining regions (p-channel transistors, bipolar transistor region A with the exception of the collector contact region 41). This operation is not shown in detail.

Figure 12:
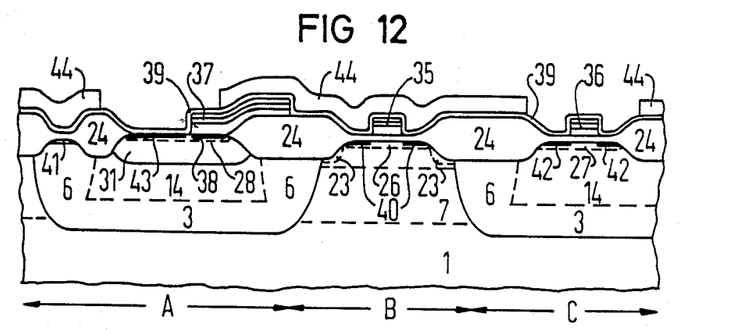

In a fashion analogous to that just described, the source/drain regions 42 of the p-channel transistors C and the p+ base contact region 43 of the bipolar transistor A are generated by a boron ion implantation having a base and energy of $4 \times 10^{15}$ cm$^{-2}$ and 40 keV. The n-channel transistor regions B and the collector terminal region 41 of the bipolar transistor A are thereby covered with a photoresist mask 44. The emitter terminal 37 serves as an implantation mask. The spacing between the emitter and base terminal (38, 43) is defined by the spacer oxide 39. This is a significant point of the invention and contributes to an increase in the packing density. Moreover, as already mentioned, the base series resistance is kept very low and the parasitic capacitances are reduced.

The completion of the circuit arrangement proceeds in a known way by means of contact hole techniques, metallization (single-layer or double-layer) and passivation.

The letters A, B and C indicated under FIG. 12 mark the regions of the bipolar transistor A and the regions of the n-channel transistor B and the p-channel transistor C.

In another version of the method of the present invention, it is possible to proceed from a p-doped substrate having a specific electrical resistance of 0.02 ohm cm, and to omit the implantation for generating the buried collector shown in FIG. 1. With a substrate having a specific electrical resistance of 20 ohm cm, the implantation shown in FIG. 1 may be omitted, and the epitaxial layer in FIG. 3 need not be applied. The process is simplified by eliminating the buried collector, whereby the annular collector terminal provides an improvement in the collector resistance and in the latch-up hardness in comparison to traditional processes which do not have a buried collector.

Furthermore, the sequence of the deposition of polysilicon and metal silicide can be interchanged in the generation of the gate electrode and the emitter terminal. Alternatively, the doping of the polysilicon can be carried out without ion implantation but with vapor phase deposition.

Figure 13:
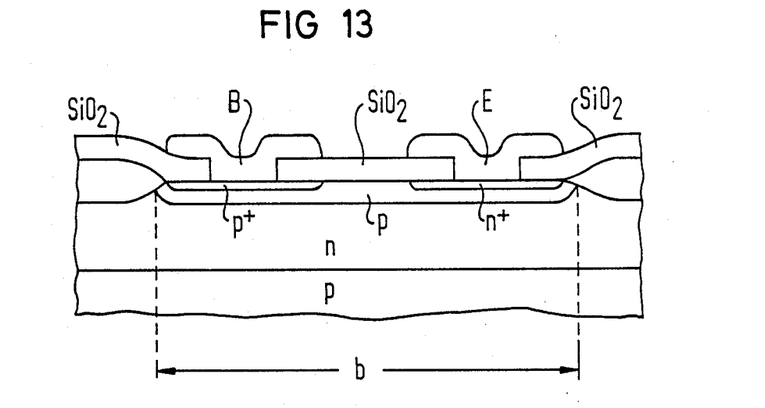
FIGS. 13 and 14 show the relative size comparison of the base-emitter complex of an npn transistor manufactured according to a known method (FIG. 13) and in accordance with the method of the present invention (FIG. 14).
Figure 14:
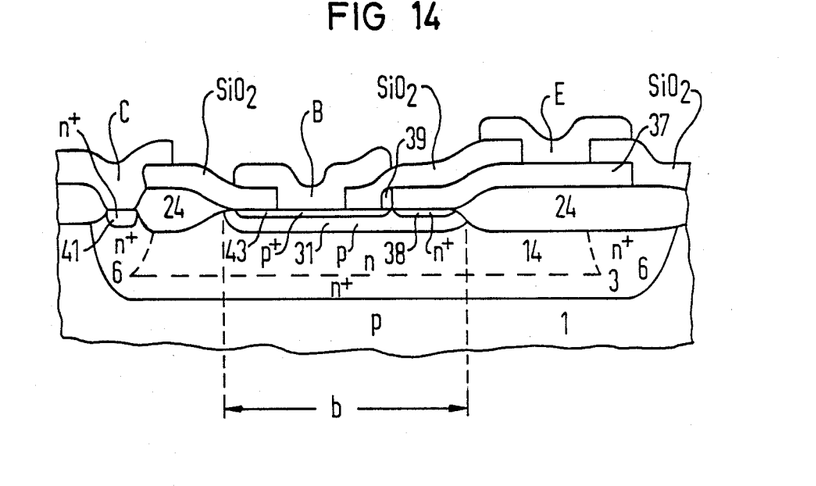

FIGS. 13 and 14 illustrate a relative size comparison of the base B emitter E complex of an npn transistor in accordance with a traditional process (FIG. 13) and in accordance with the method of the invention (FIG. 14). The minimum base width is identified with the letter (b). Otherwise, only the more important reference characters from FIG. 12 have been used in FIG. 14, the insulating oxide being provided with the symbol (SiO$_2$) The various dopings have also been entered in both Figures.

It will be evident that various modifications can be made to the described embodiments without departing from the scope of the present invention.

We claim as our invention:

1. A method for the manufacture of an integrated semiconductor circuit containing a bipolar transistor and complementary n-channel and p-channel MOS transistors which comprises:

(a) providing a p-doped semiconductor substrate,
   (b) providing a double insulating layer of silicon oxide and silicon nitride over said substrate, (c) structuring said silicon nitride layer to define areas in which collector terminals are to be formed,
(d) implanting n-doping ions into said areas,
(e) removing the silicon nitride in those areas of said substrate in which n-wells are to be formed,
(f) implanting n-doping ions into the areas in which n-wells are to be formed,
(g) diffusing said n-doping ions to form said n-wells while simultaneously oxidizing the surface of the n-well areas,
(h) implanting boron ions to form a surface distal region of a channel zone of the said n-channel transistors, using the oxide surfaces produced in step (g) as a mask,
(i) applying a double layer of silicon oxide and silicon nitride after removing the previously grown oxide,
(j) implanting boron ions into the desired field oxide regions of said n-channel transistors,
(k) locally oxidizing the field oxide regions utilizing the previously deposited silicon nitride as an oxidation mask,
(l) oxidizing the surface to generate gate oxides,
(m) boron-doping the channel regions of the n-channel and p-channel transistors,
(n) boron-doping the base zone of the bipolar transistor,
(o) removing the gate oxide in the region of said base zone,
(p) depositing at least a single layer of a metal silicide over the surface,
(q) depositing a surface-wide oxide layer over said surface,
(r) implanting arsenic ions through said surface,
(s) structuring the metal silicide layer of step (p) for the manufacture of the gate electrodes of the n-channel and p-channel transistors and the emitter terminals of the bipolar transistors,
(t) generating the emitter zone of said bipolar transistors by high temperature treatment,
(u) depositing a surface-wide silicon oxide layer by vapor phase deposition on the surface,
(v) simultaneously forming the source/drain regions of the n-channel transistors and the n+ collector contact the bipolar transistor by phosphorus ion implantation,
(w) simultaneously forming the source/drain regions of the p-channel transistor and the p+ base contact of the bipolar transistors by boron ion implantation, and
(x) applying terminal electrodes to the resulting transistor structures.

2. A method according to claim 1 wherein step (b) is preceded by the steps of:
n-doping said substrate to provide n+-doped zones in said p-doped substrate and
providing a surface-wide p-doped epitaxial layer over said substrate.

3. A method according to claim 2 wherein said substrate is a p-doped (100) oriented silicon substrate by a specific electrical resistance of about 20 ohm cm.

4. A method according to claim 1 wherein said substrate is a p-doped (100) oriented silicon substrate having a specific electrical resistance of about 0.02 ohm cm.

5. A method according to claim 2 wherein the specific electrical resistance of said p-doped epitaxial layer is about 20 ohm cm and its thickness is about 3 microns.

6. A method according to claim 1 wherein the vapor phase deposition of step (u) comprises thermally decomposing tetraethylorthosilicate.

7. A method according to claim 1 wherein the implanting of arsenic ions of step (r) occurs before the surface-wide oxide deposition of step (q).

8. A method according to claim 1 wherein step (p) involves depositing a double layer of polysilicon and a metal silicide preferably tantalum silicide.

9. A method according to claim 8 wherein the n-channel implantation in adjusted by an additional boron-implantation.

10. A method according to claim 1 wherein step (p) involves depositing a double layer of polysilicon and tantalum silicide, and the arsenic doping occurs during the polysilicon deposition before the tantalum silicide is deposited, followed by the surface-wide oxide deposition of step (q).

* * * * *